United States Patent [19]

Peiffer et al.

[11] Patent Number: 5,478,643
[45] Date of Patent: Dec. 26, 1995

[54] MATTE TRANSFER METALLIZATION FILM

[75] Inventors: Herbert Peiffer, Mainz; Ursula Murschall, Nierstein, both of Germany

[73] Assignee: Hoechst Aktiengesellschaft, Frankfurt am Main, Germany

[21] Appl. No.: 229,218

[22] Filed: Apr. 18, 1994

[30] Foreign Application Priority Data

Apr. 17, 1993 [DE] Germany .................. 43 12 543.3

[51] Int. Cl.$^6$ ................................................... B32B 7/12
[52] U.S. Cl. .................... 428/332; 428/349; 428/461; 428/516; 525/240
[58] Field of Search ........................... 428/349, 516, 428/332, 461; 525/240

[56] References Cited

U.S. PATENT DOCUMENTS

| | | | |
|---|---|---|---|
| 4,419,411 | 12/1983 | Park | 428/516 |
| 4,578,316 | 3/1986 | Clauson et al. | 428/516 |
| 4,622,237 | 11/1986 | Lori | 427/40 |
| 4,777,081 | 10/1988 | Crass et al. | 428/215 |
| 4,855,187 | 8/1989 | Osgood, Jr. et al. | 428/516 |
| 4,960,637 | 10/1990 | Biczenczuk | 428/314.4 |
| 5,110,670 | 5/1992 | Janocha et al. | 428/216 |

FOREIGN PATENT DOCUMENTS

| | | |
|---|---|---|
| 0538746 | 4/1993 | European Pat. Off. . |
| 0538747 | 4/1993 | European Pat. Off. . |
| 0563796 | 10/1993 | European Pat. Off. . |
| 4135096 | 4/1993 | Germany . |
| 2125802 | 3/1984 | United Kingdom . |

OTHER PUBLICATIONS

Patent Abstracts of Japan, vol. 16, No. 306 (M–1276)6 & JP–A–04 086 260, Jul. 1992.
Database WPI, Derwent Publications Ltd., AN 91–298804 & JP–A–3 197 541, Aug. 1991.

*Primary Examiner*—Edith Buffalow
*Attorney, Agent, or Firm*—Foley & Lardner

[57] ABSTRACT

The invention relates to a matte multilayer polypropylene film which includes at least one base layer containing polypropylene and migrating additives or a mixture of migrating additives, and at least one outer layer which includes a mixture or a blend of two components I and II. Component I essentially contains a propylene homopolymer or a copolymer of ethylene and propylene or ethylene and butylene or propylene and butylene or ethylene and another α-olefin having 5 to 10 carbon atoms or propylene and another α-olefin having 5 to 10 carbon atoms or a terpolymer of ethylene and propylene and butylene or ethylene and propylene and another α-olefin having 5 to 10 carbon atoms or a mixture of two or more of said homopolymers, copolymers and terpolymers or a blend of two or more of said homopolymers, copolymers and terpolymers, if desired mixed with one or more of said homopolymers, copolymers and terpolymers. Component II essentially contains an HDPE or a blend of two components A and B. Blend component A is essentially an HDPE. Blend component B is essentially a propylene homopolymer or a copolymer of ethylene and propylene or ethylene and butylene or propylene and butylene or ethylene and another α-olefin having 5 to 10 carbon atoms or propylene and another α-olefin having 5 to 10 carbon atoms or a terpolymer of ethylene and propylene and butylene or ethylene and propylene and another α-olefin having 5 to 10 carbon atoms or a mixture of two or more of said homopolymers, copolymers and terpolymers or a blend of two or more of said homopolymers, copolymers and terpolymers. The film has use in a metallization process.

15 Claims, No Drawings

MATTE TRANSFER METALLIZATION FILM

BACKGROUND OF THE INVENTION

1. Field of the Invention

The invention relates to a multilayer polypropylene film which comprises at least one base layer containing polypropylene and migrating additives or a mixture of migrating additives, and at least one outer layer which comprises a mixture or a blend of two polymer components.

The outer layer according to the invention is distinguished by a characteristic matte surface or appearance and is suitable for use as a transfer metallization film.

The invention also relates to a process for the production of the multilayer film and to the use of the film.

2. Description of Related Art

The packaging industry has a high demand for metallized papers and boards. The metal layer ensures good barrier properties against permeation by aroma, grease, moisture and atmospheric oxygen and ensures a highly attractive appearance. Papers having a metal layer are thus highly suitable as a packaging material for tobacco articles, icecream, confectionery, candy, chewing gum or fat-containing foodstuffs such as butter or cheese. Other areas of application are cosmetic products or the packaging of sterile articles in the medical sector. A further area of application is the labelling sector. In these cases, the metal layer is usually printed.

For the production of paper/metal composite materials, the transfer metallization process has proven itself in recent years. In this, the metal layer is transferred onto the paper from a polypropylene film which has been vapor-deposited with metal in vacuo. In detail, this process comprises the following individual steps: continuous metallization of the film web by vapor-deposition of the metal layer; coating of the metal layer on the film or of the paper to be metallized with an adhesive; lamination of metallized film and paper to give a film/metal/adhesive/paper composite; curing of the adhesive; and delamination of the composite, i.e., separation at the metal/film interface by peeling off the film. The film used as metal-transfer material is subsequently wound up and is thus available for a remetallization. The use of suitable formulations allows the film to be metallized more than 40 times.

Transfer metallization gives paper having a very smooth, reflective and high-sheen metallic surface. Due to this decorative property, it is frequently used for high-quality giftwrapping paper, greetings cards and packaging in which the metal layer is printed.

By contrast, other areas of application require that the metal layer of the paper/metal composite have a matte or structured surface or surface areas having different levels of sheen.

German Patent Application P 41 35 096.0 discloses multilayer polyolefin films comprising a polypropylene base layer and an outer layer made from an HDPE blend. This HDPE blend comprises HDPE and copolymers and/or terpolymers made from α-olefins and, if desired, polypropylene. The outer layer of the multilayer film has minimum sheen and maximum haze, giving the film a characteristic matte appearance.

U.S. Pat. No. 4,419,411 discloses three-layered biaxially oriented polyolefin film which is heat-sealed on both sides. In these films, polysiloxane and silicon dioxide are incorporated into both heat-sealable layers as an additive combination. The base layer essentially comprises polypropylene and contains a small amount of monocarboxamide, some of which migrates from the base layer into the two heat-sealable layers. The multilayer polyolefin film described is said to have a particularly low coefficient of friction.

U.S. Pat. No. 4,578,316 discloses a biaxially oriented multilayer polyolefin film whose base layer comprises a polypropylene homopolymer and whose outer layer comprises a blend of polypropylene and MDPE and/or HDPE. This polyolefin film has a low coefficient of friction together with a readily wettable surface. However, this film also has excellent optical transparency.

WO 89/10839 describes multilayer polyolefin films whose base layer comprises a propylene polymer and whose outer layers comprise either HDPE or an ethylene-propylene copolymer or a polypropylene, the film is stretched under particular temperature conditions. It has, in particular, a low coefficient of friction and good wettability, but simultaneously also high sheen and low haze.

EP-A-0 367 613 discloses a multilayer film comprising a vacuole-containing polypropylene base layer and an inscribable outer layer which contains a first polymer having a melt flow index of $\leq 1$ g/10 min and a second polymer which is incompatible with said first polymer. Incompatible polymer meaning that the polymers are present as separable phases. An example given of the first polymer is an HDPE having a density from 0.92 to 0.97 g/cm$^3$. The incompatible polymer is polypropylene or a copolymer of propylene or a terpolymer of propylene. The film described has an opaque appearance, i.e., it is essentially non-transparent to light. The film described has a density of 0.69 g/cm$^3$. This film cannot be employed for many applications due to its opacity, EP-A-0 352 463 describes a biaxially stretch-oriented film comprising a base layer with outer layers on both sides, and inert additives, in particular inorganic additives. The three layers are made from polyolefin, and the base layer contains the additives which migrate from the base layer into the outer layers. The film is suitable for the transfer metallization process. The base layer contains the inert additive in the form of finely divided particles. These particles partly project out of the base layer and are fully covered by the outer layers. At least one of the two outer surfaces of the outer layers has increased roughness at least in certain areas as a consequence of the particles projecting out of the base layer. The film is distinguished by a high reuse rate and improved printability of the transferred metal layer. It is also disclosed that the film offers the possibility of providing the transferred metal layer with reduced sheen.

EP-A-0 175 259 describes a biaxially stretch-oriented transfer metallization film based on polypropylene. The film is a three-layer film produced by coextrusion, comprising a base layer of propylene homopolymer and outer layers applied to both sides thereof. The base layer contains an additive supply of migrating monomers in an amount from 0.01 to 2.0% by weight, based on the weight of the polymer forming the base layer. The outer layers comprise polypropylene of lower viscosity than the polypropylene of the base layer.

All known transfer metallization films are unsatisfactory with respect to the appearance of the transferred metal layer. According to the known art, the metal layers have moderate to high sheen, which is disadvantageous for certain applications. The uniformity of the transferred metal layer is frequently unsatisfactory, in particular flaws frequently appear in the form of so-cajoled lightening marks. The lightening marks are caused by poor antistatic properties which causes considerable charging to occur on the film surface, which can in turn result in sudden discharges. The discharges cause increased surface tension at individual points of the film surface, in the form of the lightening marks. These lightening marks on the film are invisible even to the naked eye. However, lightening marks alter the metal adhesion at these points, which results in the lightening marks being visible in the transferred metal layer.

In addition, the known films are unsatisfactory with respect to their make-up properties. Transfer metallization films are used up to 40 times, i.e., are also wound up 40 times. During this, no winding faults may occur, particularly no telescoping of the rolls and no elongation. These problems occur particularly frequently in the case of wide rolls, i.e., those rolls having a width of greater than 1.5 m.

SUMMARY OF THE INVENTION

One object of the present invention is to provide a multilayer film which is distinguished by a matte appearance on at least one surface. The haze and sheen of the surface(s) should be optimized with respect to this desired matte characteristic. At the same time, a homogeneous film appearance without interfering spots or streaks is important, in order to enable uniform metallizability and an evenly transferred metal layer. In addition, good printability of the transferred metal layer is required. The film should have good antistatic properties and few lightening marks, preferably none at all. It should be re-usable many times and have good winding and processing properties.

Another object of the present invention is to provide a method for the production of the multilayer polypropylene film by a coextrusion process. Still another object of the present invention is to provide a method for metallization of a sheet-like support such as paper, board or glass using the multilayer polypropylene film.

In accomplishing the foregoing objectives, there has been provided according to one aspect of the present invention a multilayer polypropylene film having at least one matte surface which comprises at least one base layer containing polypropylene and migrating additives, or a mixture of migrating additives, and at least one outer layer which comprises a mixture or a blend of two components I and II.

Component I of the mixture or blend is a propylene homopolymer or a copolymer of α-olefins having 2 to 10 carbon atoms or a terpolymer of α-olefins having 2 to 10 carbon atoms or a mixture of two or more of said homopolymers, copolymers and terpolymers or a blend of two or more of said homopolymers, copolymers and terpolymers.

Component II of the mixture or blend is a high-density polyethylene (HDPE) or a blend of HDPE and one or more further polymers selected from the group consisting of a propylene homopolymer, a copolymer of α-olefins having 2 to 10 carbon atoms, a terpolymer of α-olefins having 2 to 10 carbon atoms, and blends of copolymers and terpolymers of α-olefins having 2 to 10 carbon atoms.

Preferably, component I is selected from the group consisting of a propylene homopolymer, a copolymer of ethylene and propylene, a copolymer of ethylene and butylene, a copolymer of propylene and butylene, a copolymer of ethylene and another α-olefin having 5 to 10 carbon atoms, a copolymer of propylene and another α-olefin having 5 to 10 carbon atoms, a terpolymer of ethylene and propylene and butylene, a terpolymer of ethylene and propylene and another α-olefin having 5 to 10 carbon atoms, mixtures or blends thereof, and a blend of two or more of said homopolymers, copolymers and terpolymers mixed with one or more of said homopolymers, copolymers and terpolymers.

Preferably, component II is selected from the group consisting of an HDPE and a blend of two components A and B, where blend component A is preferably an HDPE and blend component B is selected from the group consisting of a propylene homopolymer, a copolymer of ethylene and propylene, a copolymer of ethylene and butylene, a copolymer of propylene and butylene, a copolymer of ethylene and another α-olefin having 5 to 10 carbon atoms, a copolymer of propylene and another α-olefin having 5 to 10 carbon atoms;

a terpolymer of ethylene and propylene and butylene, a terpolymer of ethylene and propylene and another α-olefin having 5 to 10 carbon atoms, and mixtures or blends thereof.

In a preferred embodiment, the HDPE has an MFI from about 0.2 to 50 g/10 min, a viscosity index from about 100 to 450 cm$^3$/g, a density from about 0.93 to 0.97 g/cm3, a degree of crystallization from about 35 to 80% and a melting point of about 120° to 150° C.

In another preferred embodiment, the migrating additives comprise tertiary aliphatic amines and/or fatty acid amides and are present in the base layer in an amount from about 0.05 to 2% by weight.

Another aspect of the present invention provides for a process for the production of the multilayer polypropylene film comprising the steps of:

coextruding the melts corresponding to the individual layers of the film through a flat-film die; taking the film off over a take-off roll whose temperature is between about 40° and 100° C.; biaxially stretching the film at a longitudinal stretching ratio of about 4:1 to 7:1 and a transverse stretching ratio of about 8:1 to 10:1; heat setting the biaxially stretched film; if desired corona treating; and subsequently winding up the film.

Yet another aspect of the present invention provides for a process for the metallization of sheet-like support material, comprising the steps of: depositing a metal layer onto the film; and transferring the metal layer from the film to the sheet-like support.

Other objects, features and advantages of the invention will become apparent to persons skilled in the art from the detailed description of preferred embodiments that follows.

DETAILED DESCRIPTION OF THE PREFERRED EMBODIMENTS

This object is achieved according to the present invention by a multilayer film of the generic type mentioned above, where the outer layer comprises a mixture or blend of two components I and II.

Component I preferably comprises a propylene homopolymer or a copolymer of ethylene and propylene or ethylene and butylene or
propylene and butylene or
ethylene and another α-olefin having 5 to 10 carbon atoms or
propylene and another α-olefin having 5 to 10 carbon atoms or
a terpolymer of
ethylene and propylene and butylene or
ethylene and propylene and another α-olefin having 5 to 10 carbon atoms or
a mixture of two or more of said homopolymers, copolymers and terpolymers or
a blend of two or more of said homopolymers, copolymers and terpolymers, if desired mixed with one or more of said homopolymers, copolymers and terpolymers.

Component II preferably comprises an HDPE or a blend of two blend components A and B, where
blend component A is preferably an HDPE and
blend component B is preferably
a propylene homopolymer or
a copolymer of
ethylene and propylene or
ethylene and butylene or
propylene and butylene or
ethylene and another α-olefin having 5 to 10 carbon atoms or
propylene and another α-olefin having 5 to 10 carbon atoms or
a terpolymer of
ethylene and propylene and butylene or
ethylene and propylene and another α-olefin having 5 to 10 carbon atoms or
a mixture of two or more of said homopolymers, copolymers and terpolymers or
a blend of two or more of said homopolymers, copolymers and terpolymers,
and the film is matte.

For the purposes of the present invention, mixtures are taken to mean mechanical mixtures prepared from the individual components. Generally, the individual constituents are combined as small compression moldings, for example lenticular or spherical granules, and mechanically mixed using a suitable vibrating device.

For the purposes of the present invention, a blend is an alloy-like compound of the individual components which cannot be re-separated into the original constituents. A blend has similar properties to a homogeneous material and can be characterized correspondingly by suitable parameters.

Films according to the invention prepared from a mixture of polymers are characterized by a less homogeneous appearance than films prepared from polymer blends.

The base layer of the multilayer film according to the invention comprises a propylene polymer and migrating additives or mixtures of migrating additives. The propylene polymer comprises predominantly (at least about 90%) propylene and has a melting point from about 140° C. or above, preferably from about 150° to 170° C. Isotactic homopolypropylene having an n-heptane-soluble content of about 6% by weight or less, based on the isotactic homopolypropylene, copolymers of ethylene and propylene having an ethylene content of about 5% by weight or less, copolymers of propylene with $C_4$–$C_8$-α-olefins having an α-olefin content of about 5% by weight or less are preferred propylene polymers for the base layer. Isotactic homopolypropylene is particularly preferred. The stated percentages by weight relate to the respective copolymer. The propylene polymer of the base layer generally has a melt flow index from about 0.5 g/10 min to 10 g/10 min, preferably from about 1.5 g/10 min to 4 g/10 min, at 230° C. and a force of 21.6N (DIN 53 735). The migrating additives of the base layer must not change the structure of the base layer. In particular, the term "additives" does not cover fillers. According to conventional terminology, fillers are particulate additives which generate vacuole-like cavities in the layer. The film according to the invention has an essentially transparent base layer, i.e., one containing no vacuoles.

The base layer contains a migrating additive or a mixture of migrating additives. For the purposes of the present invention, migrating additives are defined as compounds which are capable of slowly transferring from the base layer into the outer layer and reaching the outer surface of the film, where they develop their action. The migrating additives have a dehesive action, similar to that of a release coat, i.e., the printing ink and metal adhesion is reduced. Preferred migrating additives are tertiary aliphatic amines and fatty acid amides.

Tertiary aliphatic amines are compounds of the formula (I):

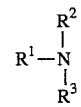

in which
$R^1$ is a hydroxyl-substituted alkyl radical having 1 to 6 carbon atoms, preferably a 2-hydroxyethyl radical, and
$R^2$ and $R^3$ may be identical or different and are a long-chain alkyl radical having 10 to 20 carbon atoms, preferably 12 to 18 carbon atoms.

The long-chain alkyl radicals $R^2$ and $R^3$ are preferably essentially unbranched and essentially saturated. N,N-bis(2-hydroxyethyl)alkylamines having 12 to 18 carbon atoms in the alkyl radical have proven particularly advantageous.

Fatty acid amides are compounds of the formula (II):

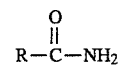

in which R is a long-chain aliphatic alkyl radical having 10 to 20 carbon atoms. The alkyl radical R is preferably essentially unbranched and essentially saturated. A particularly suitable fatty acid amide is stearamide.

The migrating additives are generally added to the base layer in an amount from about 0.05 to 2% by weight, preferably from about 0.1 to 1% by weight, more preferably from about >0.3 to 1% by weight, based on the base layer. These amount data are based on the total amount of migrating additive added, i.e., the amount of tertiary aliphatic amine or the amount of fatty acid amide or the combined amount of tertiary aliphatic amine and fatty acid amide if both are present.

In a preferred embodiment, a mixture of various migrating additives, preferably a mixture of the above-described tertiary aliphatic amines and fatty acid amides, is added to the base layer. A mixture of N,N-bis(2-hydroxyethyl)alkylamines containing alkyl radicals having 12 to 18 carbon atoms and stearamide is particularly preferred.

The ratio between amine and amide can vary within broad limits. The proportion of amine is in the range from about 30 to 70% by weight, preferably in the range from about 40 to 60% by weight, in each case based on the mixture of amine and amide. The amide proportion naturally varies correspondingly.

At least one outer layer of the multilayer film according to the invention comprises a mixture of the two components I and II described below in greater detail and, if desired, additives.

Component I of the outer layer mixture or of the blend preferably comprises
  a propylene homopolymer or
  a copolymer of
    ethylene and propylene or
    ethylene and butylene or
    propylene and butylene or
    ethylene and another α-olefin having 5 to 10 carbon atoms or
    propylene and another α-olefin having 5 to 10 carbon atoms or
  a terpolymer of
    ethylene and propylene and butylene or
    ethylene and propylene and another α-olefin having 5 to 10 carbon atoms or
  a mixture of two or more of said homopolymers, copolymers and terpolymers or
  a blend of two or more of said homopolymers, copolymers and terpolymers, if desired mixed with one or more of said homopolymers, copolymers and terpolymers.

In a preferred embodiment, Component I preferably comprises
  a propylene homopolymer or
  a copolymer of
    ethylene and propylene or
    ethylene and 1-butylene or
    propylene and 1-butylene or
  a terpolymer of
    ethylene and propylene and 1-butylene or
    ethylene
  a mixture of two or more of said homopolymers, copolymers and terpolymers or
  a blend of two or more of said homopolymers, copolymers and terpolymers, if desired mixed with one or more of said homopolymers, copolymers and terpolymers.

Particular preference is given to propylene homopolymers or
      random ethylene-propylene copolymers having
        an ethylene content from about 2 to 10% by weight, preferably from about 5 to 8% by weight, or
      random propylene-1-butylene copolymers having
        a butylene content from about 4 to 25% by weight, preferably from about 10 to 20% by weight,
      in each case based on the total weight of the copolymer, or
      random ethylene-propylene-1-butylene terpolymers having
        an ethylene content from about 1 to 10% by weight, preferably from about 2 to 6% by weight, and
        a 1-butylene content from about 3 to 20% by weight, preferably from about 8 to 10% by weight,
      in each case based on the total weight of the terpolymer, or
    a blend of an ethylene-propylene-1-butylene terpolymer and a propylene-1-butylene copolymer
        having an ethylene content from about 0.1 to 7% by weight
        and a propylene content from about 50 to 90% by weight
        and a 1-butylene content from about 10 to 40% by weight,
      in each case based on the total weight of the polymer blend.

The propylene homopolymer employed as or in component I comprises predominantly (at least about 90%) propylene and has a melting point of about 140° C. or above, preferably from about 150° to 170° C. Isotactic homopolypropylene having an n-heptane-soluble content of 6% by weight or less, based on the isotactic homopolypropylene, is preferred. The homopolymer of component I or the homopolymer present therein generally has a melt flow index from about 0.5 g/10 min to 15 g/10 min, preferably from about 1.5 g/10 min to 6 g/10 min, at 230° C. and a force of 21.6N (DIN 53 735).

Component II of the outer layer mixture preferably comprises an HDPE or a blend comprising HDPE as component A and a component B.

For the purposes of the present invention, HDPE is taken to mean high-pressure polyethylenes which have the following properties:

1. The melt flow index (MFI), measured in accordance with DIN 53 735 or ISO 1133 at 50 N/190° C., is in the range from about 0.2 to 50 g/10 min, preferably from about 1 to 45 g/10 min, particularly from about 5 to 35 g/10 min.

2. The viscosity index, measured in accordance with DIN 53 728, Part 4, or ISO 1191, is in the range from about 100 to 450 cm³/g, preferably from about 120 to 280 cm³/g.

3. The crystallinity is from about 35 to 80%, preferably from about 50 to 80%.

4. The density, measured at 23° C. in accordance with DIN 53 479, Method A, or ISO 1183, is in the range from about 0.93 to 0.97 g/cm³, preferably from about 0.95 to 0.96 g/cm³.

5. The melting point, measured by a differential scanning calorimeter (DSC) (maximum of the melting curve, heating rate 20° C./min) is between about 120° and 150° C. preferably between about 125° and 135° C.

The HDPE as component II and HDPE as blend component A is selected from the above-described polyethylenes, so that the same HDPE as blend component A is in principle suitable as component II.

Blend component B advantageously comprises
  a propylene homopolymer or
  a copolymer of
    ethylene and propylene or
    ethylene and butylene or
    propylene and butylene or
    ethylene and another α-olefin having 5 to 10 carbon atoms or
    propylene and another α-olefin having 5 to 10 carbon atoms or
  a terpolymer of
    ethylene and propylene and butylene or
    ethylene and propylene and another α-olefin having 5 to 10 carbon atoms or
  a mixture of two or more of said homopolymers, copolymers and terpolymers or
  a blend of two or more of said homopolymers, copolymers and terpolymers.

In a preferred embodiment, blend component B comprises
  a propylene homopolymer or
  a copolymer of
    ethylene and propylene or
    ethylene and 1-butylene or
    propylene and 1-butylene or
  a terpolymer of
    ethylene and propylene and 1-butylene or a mixture of two or more of said homopolymers, copolymers and terpolymers or a blend of two or more of said homopolymers, copolymers and terpolymers.

Particular preference being given to propylene homopolymers or random ethylene-propylene copolymers having an ethylene content from about 2 to 10% by weight, preferably from about 5 to 8% by weight, or random propylene-1-butylene copolymers having a butylene content from about 4 to 25% by weight, preferably from about 10 to 20% by weight, in each case based on the total weight of the copolymer, or random ethylene-propylene-1-butylene terpolymers having an ethylene content from about 1 to 10% by weight, preferably from about 2 to 6% by weight, and a 1-butylene content from about 3 to 20% by weight, preferably from about 8 to 10% by weight, in each case based on the total weight of the terpolymer, or a blend of an ethylene-propylene-1-butylene terpolymer and a propylene-1-butylene copolymer having an ethylene content from about 0.1 to 7% by weight and a propylene content from about 50 to 90% by weight and a 1-butylene content from about 10 to 40% by weight, in each case based on the total weight of the polymer blend.

The propylene homopolymer employed as or in blend component B comprises predominantly (at least about 90%) propylene and has a melting point of 140° C. or above, preferably from about 150° to 170° C. Isotactic homopolypropylene having an n-heptane-soluble content of about 6% by weight or less, based on the isotactic homopolypropylene, is preferred. The homopolymer of blend component B or the homopolymer present therein generally has a melt flow index from about 0.5 g/10 min to 15 g/10 min, preferably from about 1.5 g/10 min to 6 g/10 min, at 230° C. and a force of 21.6N (DIN 53 735).

The ratio (weight ratio) between the two blend components A and B is from about A:B=20:80 to A:B= 80:20, preferably from about A:B=40:60 to A:B=60:40, more preferably about A:B=45:55.

The blend of components A and B has a melt flow index (DIN 53 735 at 230° C. and a load of 21.6N) from about 1.5 g/10 min to 12 g/10 min, preferably from about 2.5 g/10 min to 6 g/10 min, the melt flow index of the blend preferably being higher than that of the propylene polymer of the base layer. The melting range of the blend is between about 100° and 160° C., preferably between about 120° and 150° C.

The weight ratio between the two components I and II of the outer layer mixture or of the blend can vary within broad limits and depends on the intended application of the multilayer film. The ratio between components I and II can be in a range from about I:II= 10:90 to I:II=90:10, preferably from about I:II=30:70 to I:II=70:30, more preferably about I:II=50:50.

In a further embodiment, the above-described outer layer can additionally contain one or more fillers. Fillers comprise solid particles having a mean particle diameter of about ≧1 μm, preferably from about 1 to 6 μm.

Conventional fillers in the outer layer are inorganic and/or organic materials which are incompatible with polypropylene, such as aluminum oxide, aluminum sulfate, barium sulfate, calcium carbonate, magnesium carbonate, silicates, such as aluminum silicate (kaolin clay) and magnesium silicate (talc), and silicon dioxide. Calcium carbonate and silicon dioxide are preferred as inorganic fillers. Suitable organic fillers are conventional polymers which are incompatible with the polymer of the base layer, in particular those such as HDPE, polyesters, polystyrenes, polyamides and halogenated organic polymers. Polyesters, such as polybutylene terephthalates are preferred. For the purposes of the present invention "incompatible materials or incompatible polymers" means that the material or polymer is present in the film as a separate particle or as a separate phase.

The amount of filler in the outer layer is up to about 15% by weight and is generally in the range from about 1 to 10% by weight, preferably in the range from about 3 to 5% by weight, in each case based on the outer layer.

$SiO_2$ as solid particles is preferably added to the outer layer in these filler-containing embodiments. $SiO_2$ is generally prepared by grinding silica gel and is a synthetic, highly porous, pure silicic acid. In contrast to crystalline silicic acids, the $SiO_2$ has a completely amorphous structure. The $SiO_2$ content is generally greater than about 95%, in particular in the range from about 98 to 99.5%. Coarse $SiO_2$ having a mean particle diameter from about 3 to 5 μm or fine $SiO_2$ having a mean particle diameter from about 1 to 2.5 μm or a mixture of coarse and fine $SiO_2$ is suitable for use in the present invention.

In a preferred embodiment, the $SiO_2$ particles having a mean particle diameter from about 3 to 5 μm have been subjected to organic aftertreatment coating and have a coating containing from about 0.5 to 5% of an aliphatic carboxylic acid. Preferred aliphatic carboxylic acids are aliphatic hydroxydi- and tri-carboxylic acids or stearic acid. In general, the acids contain from two to five, preferably two to three, hydroxyl groups. Preferred aliphatic carboxylic acids are tartronic acid (hydroxymalonic acid), malic acid (monohydroxysuccinic acid), tartaric acid (dihydroxysuccinic acid) and citric acid. Citric acid-containing coatings have proven particularly advantageous. As a consequence of the organic coating, the coarse $SiO_2$ particles are slightly acidic in aqueous solutions. The pH of a 5% strength aqueous suspension is in the range from about 3 to 5, and is preferably about 4.

The multilayer film according to the invention comprises at least the above-described base layer and at least one matte outer layer which comprises the above-described mixture or blend. Depending on its proposed application, the multilayer film may have a further outer layer on the opposite side. If desired, one or more interlayers may be applied between the base layer and the outer layer(s).

The structure, thickness and composition of a second outer layer can be selected independently of the matte outer layer, which according to the present invention is already present preferred embodiments of the multilayer film have three layers. It is also possible for the second outer layer to comprise one of the above-described mixtures of the present invention, which is not necessarily identical to that of the first outer layer. However, the second outer layer may also comprise any other conventional outer layer polymer.

The thickness of the matte outer layer(s) is greater than about 0.4 μm, preferably in the range from about 0.8 to 4 μm, more preferably from about 1 to 3 μm, where outer layers on both sides can have identical or different thicknesses.

The overall thickness of the multilayer polyolefin film according to the present invention can vary within broad limits and depends on the intended use. It is preferably from about 5 to 70 µm, particularly from about 10 to 50 µm, with the base layer making up from about 50 to 90% of the overall film thickness.

The density of the film according to the invention is generally at least about 0.8 g/cm³ and is preferably in the range from about 0.9 to 0.92 g/cm³.

In order to improve the adhesion properties of the outer layer(s), at least one surface of the film may be corona- or flame-treated. If desired, the corresponding treatment can be carried out on both surfaces.

In order further to improve specific properties of the polypropylene film according to the invention, both the base layer and the outer layer(s) may contain further additives in an effective amount, preferably stabilizers and/or neutralizers which are compatible with the polymers of the base layer and of the outer layer(s). All amount data hereinafter in percent by weight (% by weight) in each case relate to the layer or layers to which the additive can be added.

Stabilizers which can be employed are conventional compounds which have a stabilizing action for polymers of ethylene, propylene and other α-olefins. Their added amount is between about 0.05 and 2% by weight. Particularly suitable are phenolic stabilizers, alkali metal or alkaline earth metal stearates and/or alkali metal or alkaline earth metal carbonates.

Phenolic stabilizers are preferably employed in an amount from about 0.1 to 0.6% by weight, particularly from about 0.15 to 0.3% by weight, and having a molecular weight of greater than 500 g/mol. Pentaerythrityl tetrakis[3-(3,5-di-tert-butyl-4-hydroxyphenyl)propionate] and 1,3,5-trimethyl-2,4,6-tris(3,5-di-tert-butyl-4-hydroxybenzyl) benzene are particularly advantageous.

Neutralizers are preferably calcium stearate and/or calcium carbonate having a mean particle size of at most about 0.7 µm, an absolute particle size of less than about 10 µm and a specific surface area of at least about 40 m²/g.

The invention furthermore relates to a process for the production of the multilayer film according to the present invention by the coextrusion process, which is known per se.

This process is carried out by coextruding the melts corresponding to the individual layers of the film through a flat-film die, taking off the resultant film over one or more rolls for solidification, subsequently biaxially stretching (orienting) the film, heat-setting the biaxially stretched film and, if desired, corona-treating the surface layer intended for corona treatment.

The biaxial stretching (orientation) may be carried out simultaneously or consecutively. Consecutive biaxial stretching, in which stretching is carried out first longitudinally (in the machine direction) and then transversely (perpendicular to the machine direction), is preferred.

As is conventional in coextrusion, the polymer or polymer mixture of the individual layers is compressed and liquefied in an extruder, with it being possible for any additives to be already present in the polymer or in the polymer mixture or added at this time. The melts are then extruded simultaneously through a flat-film die (slot die), and the extruded multilayer film is taken off over one or more take-off rolls, where it cools and solidifies.

The resultant film is then stretched longitudinally and transversely to the extrusion direction, which results in alignment of the molecule chains. The longitudinal stretching ratio is preferably from about 4:1 to 7:1 and the transverse stretching ratio is preferably from about 8:1 to 10:1. The longitudinal stretching is expediently carried out with the aid of two rolls running at different speeds corresponding to the desired stretching ratio. The transverse stretching is expediently carried out with the aid of an appropriate tenter frame.

Biaxial stretching of the film is followed by heat-setting (heat treatment), with the film being kept at a temperature from about 140° to 160° C. for about 0.5 to 10 seconds. The film is subsequently wound up in the conventional manner by means of a wind-up unit.

It has proven particularly advantageous to keep the take-off roll or rolls at a temperature from about 10° to 100° C., preferably from about 20° to 60° C., by means of a heating and cooling circuit. This serves the purpose of cooling and solidifying the extruded film.

The temperatures at which longitudinal and transverse stretching are carried out can vary in a relatively broad range and depend on the respective composition of the outer layer mixture. In general, the longitudinal stretching is preferably carried out at about 120° to 150° C. and the transverse stretching preferably at about 155° to 190° C.

If desired, one or both surfaces of the film can, as mentioned above, be corona or flame-treated by one of the known methods after the biaxial stretching. The treatment intensity is generally in the range from 38 to 42 mN/m.

In the case of corona treatment an expedient procedure is to pass the film between two conductor elements serving as electrodes. A high voltage, usually alternating voltage (from about 5 to 20 kV and from about 5 to 30 kHz), is applied between the electrodes so that spray or corona discharges can occur. The spray or corona discharge ionizes the air above the film surface and reacts with the molecules of the film surface, causing formation of polar inclusions in the essentially non-polar polymer matrix.

For flame treatment with a polarized flame (see U.S. Pat. No. 4,622,237), a direct electric voltage is applied between a burner (negative pole) and a chill roll. The level of the applied voltage is between about 500 and 3,000 V, preferably in the range from 1,500 to 2,000 V. The applied voltage gives the ionized atoms increased acceleration, and they hit the polymer surface with greater kinetic energy. The chemical bonds within the polymer molecule are more easily broken, and formation of free radicals proceeds more rapidly. Heating of the polymer by this flame treatment is substantially less than in the case of standard flame treatment, and films can be obtained in which the heat-sealing properties of the treated side are even better than those of the untreated side.

The multilayer film according to the invention is distinguished by a very homogeneous appearance, characteristic matte sheen and excellent and uniform metallizability.

It has been found that incorporation of the above-described polyethylenes into a propylene homopolymer, propylene copolymer or propylene terpolymer outer layer surprisingly allows for both a very homogeneous film appearance and the desired matte characteristics. This result was all the more surprising as experiments conducted on the basis of EP-A-0 367 613 did not give the desired result. Producing the film described therein, but without filler in the base layer, gave a film whose base layer no longer contained vacuoles, i.e., was no longer opaque. However, the film had a spotty appearance which was not covered on metallization, but was instead transferred. Neither the film itself nor the transferred metal layer had a uniform, matte appearance. The haze of this film was less than 10 at some points, although haze values of greater than 10 were found at other points (measured in accordance with ASTM-D 1003). The sheen values were likewise uneven. Overall, a film was not obtained which satisfied the "matte" requirement from its sheen, haze and uniformity of appearance.

The films according to the invention exhibit the desired 'matte' appearance if the film has a highly uniform appearance and if the sheen and haze of the films have low and high values respectively, but are not minimum and maximum values respectively. It has been found that films having sheen values (at a measurement angle of 85°, measured in accordance with ASTM-D-523-78) of less than about 80, preferably less than about 60, and a haze (measured in accordance with ASTM-D-1003) of greater than about 10, preferably greater than about 30, are matte. The respective values for sheen and haze in an embodiment only vary within relatively narrow limits, i.e., by a maximum of 20%. This requirement is achieved particularly well if the sheen is in the range from about 25 to 45 (85°, ASTM-D-5237) and the haze is in the range from about 40 to 80, preferably from about 50 to 70, and the variations of sheen and haze over the entire film are less than about 10%, preferably from 1 to 8%.

Surprisingly, the matte surface of the film according to the invention can be uniformly metallized. The uniform matte character of the film surface is retained on metallization.

The film is also significantly improved with respect to its antistatic properties. Virtually no lightening marks occur. Both the metallized film and the transferred metal layer exhibit virtually no flaws.

The metal layer can be transferred extremely well from the novel outer-layer composition, with retention of its matte character. At the same time, the film has the advantages of a high re-use rate and very good winding properties.

Surprisingly, the migrating additive supply which is known per se migrates into the HDPE-containing outer layer at a sufficient rate and in the requisite concentration. Since the migration behavior of additives in polymers is a function of the additives themselves and their concentration and also a function of the polymer matrix in which the additives migrate, it was unexpected that the migrating additive supply comprising amines and amides would have the same migration behavior in the present film having the novel outer-layer composition as in known films.

In summary, it should be noted that the multilayer film according to the invention is distinguished by a multiplicity of advantageous properties which make it particularly suitable for its preferred application as a transfer metallization film, particularly by the properties of:

a characteristic matte sheen of less than 80 at a measurement angle of 85° (ASTM-D-523-78), an optimized haze of greater than 10 (ASTM-D-1003), a particularly uniform film appearance, high roughness of the surface, a 'relatively' low coefficient of friction, very uniform metallization properties, a low number of lightening marks, excellent winding behavior and a high re-use rate.

When the film is used for the metallization of sheet-like support materials, such as paper, board or glass, the process is carried out in a conventional manner. The film is vapor-deposited with metal in a high vacuum. An adhesive layer is applied to the metal layer of the film of the metal material or to the surface of the sheet-like support material to be provided with the metal layer, and the film/metal/adhesive layer/support material composite is produced. After the adhesive has cured, which takes place during storage of the film or in-line by electron beams, the film is taken off, wound up and re-employed in this process. In the resultant composite of metal and sheet-like support material, the metallic surface has a uniform matte sheen; the sheen value is less than about 90%, preferably less than about 60% (measurement angle 85°). It also has excellent printability.

Suitable metals are metals such as gold, silver, copper, nickel, tin and aluminum. Mixtures or alloys of at least two of said metals are also suitable, with aluminum being particularly suitable. The metals are usually applied in a thickness from about 5 to 500 nm, depending on the type of substrate onto which the metal layer is to be transferred. The thickness of the metal layer is usually in the range from about 10 to 60 nm.

Processes for applying the metal layer are known. The process can be, for example, vacuum deposition, cathode spraying, plasma spraying, vapor-phase electroplating, currentless plating, electroplating and absorption, either alone or in combination with one another. The vacuum deposition process is particularly preferred for industrial operations.

The invention is now described in greater detail with reference to working examples as shown in Table 1 below. In the following examples, $C_2$ is ethylene, $C_3$ is propylene, and $C_4$ is butylene.

TABLE 1

(Examples 1 to 11)

| | Component I | Component II | I:II |
|---|---|---|---|
| E1 | $C_3$-homopolymer | HDPE + $C_3$-homopolymer | 50:50 |
| E2 | $C_2/C_3$-copolymer | HDPE + $C_3$-homopolymer | 50:50 |
| E3 | $C_2/C_3$-copolymer | HDPE + $C_3$-homopolymer | 70:30 |
| E4 | $C_2/C_3/C_4$-terpolymer + $C_3/C_4$-copolymer | HDPE + $C_2/C_3$-copolymer | 60:40 |
| E5 | $C_2/C_3$-copolymer | HDPE + $C_2/C_3$-copolymer | 50:50 |
| E6 | $C_2/C_3$-copolymer | HDPE + $C_2/C_3$-copolymer | 70:30 |
| E7 | $C_2/C_3$-copolymer | HDPE + $C_2/C_3/C_4$-terpolymer | 50:50 |
| E8 | $C_2/C_3$-copolymer | HDPE + $C_2/C_3/C_4$-terpolymer | 70:30 |
| E9 | $C_2/C_3$-copolymer | HDPE + $C_2/C_3/C_4$-terpolymer + $C_3/C_4$-Copolymer | 50:50 |
| E10 | $C_2/C_3/C_4$-terpolymer | HDPE + $C_2/C_3/C_4$-terpolymer + $C_3/C_4$-copolymer | 50:50 |

TABLE 1-continued (Examples 1 to 11)

| | Component I | Component II | I:II |
|---|---|---|---|
| E11 | $C_2/C_3/C_4$-terpolymer | HDPE + $C_2/C_3/C_4$-terpolymer | 50:50 |
| E12 | $C_4$-homopolymer | HDPE | 50:50 |
| E13 | $C_2/C_3$-copolymer | HDPE | 50:50 |
| E14 | $C_2/C_3$-copolymer | HDPE | 70:30 |
| E15 | $C_2/C_3/C_4$-terpolymer | HDPE | 50:50 |
| E16 | $C_2/C_3/C_4$-terpolymer | HDPE | 70:30 |

E = Example

EXAMPLE 1

A three-layer film with a thickness of 1 mm and a layer structure XZX, i.e., the base layer Z was surrounded by two identical outer layers X, was extruded by the coextrusion process from a flat-film die at an extrusion temperature of 260° C.

The base layer essentially comprised a propylene homopolymer having an n-heptane-soluble content of 4.5% by weight and a melting point of 165° C. The melt flow index of the propylene homopolymer was 3.2 g/10 min at 230° C. and a load of 21.6N (DIN 53 735). In addition the base layer contained 0.22% by weight of an N,N-bis(hydroxyethyl)($C_{10}$–$C_{20}$)alkylamine (Armostat® 300) and 0.25% by weight of stearamide.

The two outer layers X essentially comprised a mechanical mixture of components I and II in the ratio I:II=50:50.

Component I comprised a propylene homopolymer having an n-heptane-soluble content of 4.5% by weight and a melting point of 165° C. The melt flow index of the propylene homopolymer was 6.0 g/10 min at 230° C. and a load of 21.6N (DIN 53 735).

Component II comprised a blend of two components A and B in the ratio A:B=50:50. Component A comprised an HDPE having an MFI (50 N/190° C.) of 11 g/10 min (measured in accordance with DIN 53 735), a viscosity index of 160 cm³/g (measured in accordance with DIN 53 728, Part 4), a density of 0.954 g/cm³ (measured in accordance with DIN 53 479, Method A), a degree of crystallization of 68% and a melting point of 132° C., measured by DSC. Component B comprised a propylene homopolymer having an n-heptane-soluble content of 4.5% by weight and a melting point of 165° C. The melt flow index of component B was 7.0 g/10 min at 230° C. and a load of 21.6N (DIN 53 735).

Components I and II were mixed mechanically in a Henschel mixer for 2 minutes at 500 rpm in the ratio I:II= 50:50, giving a homogeneous granule mixture.

All layers contained 0.12% by weight of pentaerythrityl tetrakis[4-(3,5-di-tert-butyl-4-hydroxyphenyl)propionate (Irganox® 1010) as stabilizer and 0.06% by weight of calcium stearate as neutralizer.

After coextrusion, the extruded three-layer film was taken off via a first take-off roll and a further trio of rolls and cooled. The film was subsequently stretched longitudinally, stretched transversely, heat set and corona-treated. The following conditions, in detail, were selected:

| Extrusion: | Extrusion temperature 260° C. |
|---|---|
| | Temperature of the first take-off roll 50° C. |
| | Temperature of the trio of rolls 50° C. |
| Longitudinal stretching: | Stretching roll T = 125° C. |
| | Longitudinal stretching by a factor of 5 |
| Transverse stretching: | Heat-up zones T = 175° C. |
| | Stretching zones T = 165° C. |
| | Transverse stretching by a factor of 10 |
| Setting: | Temperature T = 155° C. |
| Corona treatment: | Voltage: 10,000V |
| | Frequency: 10,000 Hz |

The multilayer film produced in this way had a matte surface on both sides and, directly after production, had a surface tension of from 40 to 41 mN/m.

The film had a thickness of about 21.5 μm, with the base layer having a thickness of 19 μm and each outer layer having a thickness of 1.25 μm.

EXAMPLE 2

Example 1 was repeated with the following changes. Component I comprised a random ethylene-propylene copolymer having an ethylene content of 5% by weight, based on the weight of the copolymer. The melting point of the copolymer was 134° C., and the melt flow index was 7.0 g/10 min.

EXAMPLE 3

Example 2 was repeated with the following changes. The mixing ratio between the two components I and II was I:II=70:30.

EXAMPLE 4

Example 1 was repeated with the following changes. Component I comprised a polymer blend of an ethylene-propylene-1-butylene terpolymer and a propylene-1-butylene copolymer, corresponding to a content of 0.7% by weight of ethylene, 81.3% by weight of propylene and 18% by weight of butylene, based on the polymer blend.

Component II comprised a blend of two components A and B in the ratio A:B=50:50. Component A comprised an HDPE having an MFI (50 N/190° C.) of 11 g/10 min (measured in accordance with DIN 53 735), a viscosity index of 160 cm³/g (measured in accordance with DIN 53 728, Part 4), a density of 0.954 g/cm³ (measured in accordance with DIN 53 479, Method A), a degree of crystallization of 68% and a melting point of 132° C., measured by DSC. Component B comprised a random ethylene-propylene copolymer having an ethylene content of 5% by weight, based on the weight of the copolymer. The melting point of the copolymer was 134° C. and the melt flow index was 7.0 g/10 min.

The mixing ratio between the two components I and II was I:II=60:40.

EXAMPLE 5

Example 4 was repeated with the following changes. Component I comprised a random ethylene-propylene copolymer having an ethylene content of 5% by weight, based on the weight of the copolymer. The melting point of the copolymer was 134° C. and the melt flow index was 7.0 g/10 min.

The mixing ratio between the two components I and II was I:II=50:50.

EXAMPLE 6

Example 5 was repeated with the following changes. The mixing ratio between the two components I and II was I:II=70:30.

EXAMPLE 7

Example 5 was repeated with the following changes. Component II comprised a blend of two components A and B in the ratio A:B=50:50. Component A comprised an HDPE having an MFI (50 N/190° C.) of 11 g/10 min (measured in accordance with DIN 53 735), a viscosity index of 160 cm$^3$/g (measured in accordance with DIN 53 728, Part 4), a density of 0.954 g/cm$^3$ (measured in accordance with DIN 53 479, Method A), a degree of crystallization of 68% and a melting point of 132° C., measured by DSC. Component B comprised a terpolymer of ethylene, propylene and 1-butylene units, having an ethylene content of 1.9% by weight and a 1-butylene content of 8.4% by weight, based on the terpolymer.

EXAMPLE 8

Example 7 was repeated with the following changes. The mixing ratio between the two components I and II was I:II=70:30.

EXAMPLE 9

Example 5 was repeated with the following changes. Component II comprised a blend of two components A and B in the ratio A:B=50:50. Component A comprised an HDPE having an MFI (50 N/190° C.) of 11 g/10 min (measured in accordance with DIN 53 735), a viscosity index of 160 cm$^3$/g (measured in accordance with DIN 53 728, Part 4), a density of 0.954 g/cm$^3$ (measured in accordance with DIN 53 479, Method A), a degree of crystallization of 68% and a melting point of 132° C., measured by DSC. Component B comprised a polymer blend of an ethylene-propylene-1-butylene terpolymer and a propylene-1-butylene copolymer, corresponding to a content of 0.7% by weight of ethylene, 81.3% by weight of propylene and 18% by weight of butylene, based on the polymer blend.

EXAMPLE 10

Example 9 was repeated with the following changes. Component I comprised a terpolymer of ethylene, propylene and 1-butylene units, having an ethylene content of 1.9% by weight and a 1-butylene content of 8.4% by weight, based on the terpolymer.

EXAMPLE 11

Example 7 was repeated with the following changes. Component I comprised a terpolymer of ethylene, propylene and 1-butylene units, having an ethylene content of 1.9% by weight and a 3-butylene content of 8.4% by weight, based on the terpolymer.

EXAMPLE 12

Example 1 was repeated with the following changes. Component II comprised a pure HDPE having an MFI (50 N/190° C.) of 11 g/10 min (measured in accordance with DIN 53 735), a viscosity index of 160 cm$^3$/g (measured in accordance with DIN 53 728, Part 4), a density of 0.954 g/cm$^3$ (measured in accordance with DIN 53 479, Method A), a degree of crystallization of 68% and a melting point of 132° C., measured by DSC.

EXAMPLE 13

Example 2 was repeated with the following changes. Component II corresponded to that of Example 12.

EXAMPLE 14

Example 3 was repeated with the following changes. Component II corresponded to that of Example 12.

EXAMPLE 15

Example 11 was repeated with the following changes. Component II corresponded to that of Example 12.

EXAMPLE 16

Example 15 was repeated with the following changes. The mixing ratio between the two components I and II was I:II=70:30.

The raw materials and films were characterized using the following measurement methods:

Melt flow index

The melt flow index was measured in accordance with DIN 53 735 at a lead of 21.6N and 230° C. or at a lead of 50N and 190° C.

Melting point

DSC measurement, maximum of the melting curve, heating rate 20° C./min.

Viscosity index J

The viscosity index is a measure of the molecular weight. The viscosity index is measured in accordance with DIN 53 728, Part 4, in 0.1% strength decahydronaphthalene solution at 135° C.

Density σ

The density is determined in accordance with DIN 53 479, Method A.

Degree of crystallization α

The degree of crystallization can be determined from the following equation:

$$\alpha = \frac{\rho - \rho_{amorphous}}{\rho_{crystalline} - \rho_{amorphous}} \times 100\%$$

where $\rho_{amorphous} = 0.8549$ g/cm$^3$ $\rho_{crystalline} = 1.0005$ g/cm$^3$ $\rho$ = density of the HDPE grade employed.

Haze

The haze of the film was measured in accordance with ASTM-D 1003-52.

Sheen

The sheen was determined in accordance with DIN 67 530. The reflection value was measured as an optical parameter for the surface of a film. In accordance with the standards ASTM-D 523-78 and ISO 2813, the angle of incidence was set at 60° or 85°. A light beam hits the planar test surface at the set angle of incidence and is reflected or scattered thereby. The light beams incident on the photoelectronic receiver are indicated as a proportional electrical quantity. The measurement value is dimensionless and must be specified together with the angle of incidence.

Seal seam strength

For the determination, two film strips 15 mm in width were laid one on top of the other and heat-sealed at 130° C. for 0.5 seconds at a pressure of 10 mm$^2$ (instrument used: Brugger type NDS instrument, with sealing jaws heated on one side). The seal seam strength was determined by the T-peel method.

Roughness

The roughness was determined in accordance with DIN 4768.

Friction

The friction was determined in accordance with DIN 53 375.

Surface tension

The surface tension was determined by the ink method (DIN 53 364).

Printability

The corona-treated films were printed 14 days after production (short-term assessment) and 6 months after production (long-term assessment). The ink adhesion was assessed by an adhesive-tape test. If a small amount of ink was removable by means of an adhesive tape, the ink adhesion was assessed as being moderate, and if a significant amount of ink was removable, it was assessed as being poor.

Water vapor barrier

The water vapor barrier action is measured in accordance with DIN 53 122 at 23° C. and 85% relative atmospheric humidity and gives the amount of water in grams passing through per square meter and per day.

Table 2 below shows the properties of the polypropylene films of the examples.

TABLE 2

| Ex. | Sheen (ASTM D-523-78) Measurement angle 85° | Haze (ASTM 1003) % | Roughness (c.o. 0.25 mm) μm | Coefficient of friction — | Surface tension after storage for 6 months mN/m | Visual assessment of the mattle appearance (++ = very good) |
|---|---|---|---|---|---|---|
| E1 | 40 | 60 | 2.5 | 0.5 | 38 | ++ |
| E2 | 32 | 66 | 3.0 | 0.4 | 39 | ++ |
| E3 | 42 | 58 | 2.3 | 0.5 | 39 | ++ |
| E4 | 38 | 62 | 2.6 | 0.3 | 39 | ++ |
| E5 | 30 | 68 | 3.2 | 0.3 | 39 | ++ |
| E6 | 38 | 63 | 2.6 | 0.4 | 39 | ++ |
| E7 | 32 | 65 | 2.9 | 0.4 | 39 | ++ |
| E8 | 38 | 52 | 2.7 | 0.4 | 39 | ++ |
| E9 | 34 | 63 | 3.3 | 0.4 | 39 | ++ |
| E10 | 36 | 62 | 2.6 | 0.4 | 39 | ++ |
| E11 | 35 | 62 | 2.6 | 0.4 | 39 | ++ |
| E12 | 31 | 68 | 3.0 | 0.4 | 39 | ++ |
| E13 | 29 | 70 | 3.2 | 0.3 | 39 | ++ |
| E14 | 32 | 66 | 2.8 | 0.3 | 39 | ++ |
| E15 | 30 | 68 | 3.0 | 0.3 | 39 | ++ |
| E16 | 34 | 64 | 2.8 | 0.4 | 39 | ++ |

What is claimed is:

1. A multilayer polypropylene film having at least one matte surface which comprises at least one base layer containing polypropylene and a migrating additive, or a mixture of migrating additives, and at least one outer layer which comprises a mixture or a blend of two components I and II, wherein component I is selected from the group consisting of
a propylene homopolymer,
a copolymer of ethylene and propylene,
a copolymer of ethylene and butylene,
a copolymer of propylene and butylene,
a copolymer of ethylene and another α-olefin having 5 to 10 carbon atoms,
a copolymer of propylene and another α-olefin having 5 to 10 carbon atoms,
a terpolymer of ethylene and propylene and butylene,
a terpolymer of ethylene and propylene and another α-olefin having 5 to 10 carbon atoms,
mixtures or blends thereof, and
a blend of two or more of said homopolymers, copolymers and terpolymers mixed with one or more of said homopolymers, copolymers and terpolymers, and component II selected from the group consisting of an HDPE and a blend of two components A and B, where blend component A is essentially an HDPE and blend component B is selected from the group consisting of
- a propylene homopolymer,
- a copolymer of ethylene and propylene,
- a copolymer of ethylene and butylene,
- a copolymer of propylene and butylene,
- a copolymer of ethylene and another α-olefin having 5 to 10 carbon atoms,
- a copolymer of propylene and another α-olefin having 5 to 10 carbon atoms,
- a terpolymer of ethylene and propylene and butylene,
- a terpolymer of ethylene and propylene and another α-olefin having 5 to 10 carbon atoms, and
- mixtures or blends thereof.

2. A multilayer polypropylene film as claimed in claim 1, wherein component I is selected from the group consisting of
- a propylene homopolymer,
- a copolymer of ethylene and propylene,
- a copolymer of ethylene and 1-butylene,
- a copolymer of propylene and 1-butylene,
- a terpolymer of ethylene and propylene and 1butylene, mixtures or blends thereof, and
- a blend of two or more of said particularly preferred homopolymers, copolymers and terpolymers mixed with one or more of said homopolymers, copolymers, terpolymers, and blend component B is selected from the group consisting of
- a propylene homopolymer,
- a copolymer of ethylene and propylene,
- a copolymer of ethylene and 1-butylene,
- a copolymer of propylene and 1-butylene,
- a terpolymer of ethylene and propylene and 1butylene,
- and mixtures and or blends thereof.

3. A multilayer polypropylene film as claimed in claim 2, wherein component I is selected from the group consisting of
- propylene homopolymers,
- random ethylene-propylene copolymers having an ethylene content from about 2 to 10% by weight,
- random propylene-1-butylene copolymers having a butylene content from about 4 to 25% by weight, in each case based on the total weight of the copolymer,
- random ethylene-propylene-1-butylene terpolymers having an ethylene content from about 1 to 10% by weight, and a 1-butylene content from about 3 to 20% by weight, in each case based on the total weight of the terpolymer, and
- a blend of an ethylene-propylene-1-butylene terpolymer and a propylene-1-butylene copolymer having an ethylene content from about 0.1 to 7% by weight and a propylene content from about 50 to 90% by weight and a 1-butylene content from about 10 to 40% by weight, in each case based on the total weight of the polymer blend, and blend component B is selected from the group consisting of
- propylene homopolymers,
- random ethylene-propylene copolymers having an ethylene content from about 2 to 10% by weight,
- random propylene-1-butylene copolymers having a butylene content from about 4 to 25% by weight, in each case based on the total weight of the copolymer,
- random ethylene-propylene-1-butylene terpolymers having an ethylene content from about 1 to 10% by weight, preferably from 2 to 6% by weight, and a 1-butylene content from about 3 to 20% by weight, in each case based on the total weight of the terpolymer and
- a blend of an ethylene-propylene-1-butylene terpolymer and a propylene-1-butylene copolymer having an ethylene content from about 0.1 to 7% by weight and a propylene content from about 50 to 90% by weight and a 1-butylene content from about 10 to 40% by weight, in each case based on the total weight of the polymer blend.

4. A multilayer polypropylene film as claimed in claim 1, wherein the HDPE has an MFI from about 0.2 to 50 g/10 min, a viscosity index from about 100 to 450 cm$^3$/g, a density from about 0.93 to 0.97 g/cm$^3$, a degree of crystallization from about 35 to 80% and a melting point of about 120° to 150° C.

5. A multilayer polypropylene film as claimed in claim 1, wherein the ratio between blend components A and B is in the range from about A:B=20:80 to A:B=80:20.

6. A multilayer polypropylene film as claimed in claim 5, wherein the ratio between blend components A and B is in the range from about A:B=40:60 to A:B=60:40.

7. A multilayer polypropylene film as claimed in claim 1, wherein the blend of components A and B has a melt flow index from about 1.5 to 12 g/10 min.

8. A multilayer polypropylene film as claimed in claim 7, wherein the blend of components A and B has a melt flow index from about 2.5 to 6 g/10 min.

9. A multilayer polypropylene film as claimed in claim 1, wherein the ratio between components I and II is in the range from about I:II=90:10 to I:II=10:90.

10. A multilayer polypropylene film as claimed in claim 1, wherein the propylene polymer of the base layer has a melting point of at least about 140° C. and the melt flow index is in the range from about 0.5 to 15 g/10 min.

11. A multilayer polypropylene film as claimed in claim 1, wherein the migrating additive or mixture of migrating additives comprise at least one of a tertiary aliphatic amine and a fatty acid amide.

12. A multilayer polypropylene film as claimed in claim 1, wherein the migrating additive or the mixture of migrating additives are present in the base layer in an amount from about 0.05 to 2% by weight.

13. A multilayer polypropylene film as claimed in claim 1, wherein the mixture of migrating additives comprises a tertiary aliphatic amine and a fatty acid amide.

14. A multilayer polypropylene film as claimed in claim 13, wherein the base layer contains, as the mixture of migrating additives, from about 0.15 to 0.5% by weight of N,N-bis(hydroxyethyl)alkylamine and from about 0.15 to 0.5% by weight of stearamide.

15. A multilayer polypropylene film as claimed in claim 1, further comprising a metal layer deposited on at least one outer layer surface.

* * * * *